(12) United States Patent
Cheng et al.

(10) Patent No.: US 12,627,278 B2
(45) Date of Patent: May 12, 2026

(54) SURFACE ACOUSTIC WAVE DEVICE COMPRISING MULTI-LAYER INTERDIGITAL TRANSDUCER ELECTRODE

(71) Applicant: SKYWORKS SOLUTIONS, INC., Irvine, CA (US)

(72) Inventors: Kezia Cheng, Lowell, MA (US); Alan Sangone Chen, Leesburg, FL (US); Benjamin Paul Abbott, Irvine, CA (US); Rei Goto, Osaka (JP); Yosuke Hamaoka, Suita (JP); Michael David Hill, Emmitsburg, MD (US)

(73) Assignee: SKYWORKS SOLUTIONS, INC., Irvine, CA (US)

( * ) Notice: Subject to any disclaimer, the term of this patent is extended or adjusted under 35 U.S.C. 154(b) by 946 days.

(21) Appl. No.: 17/885,120

(22) Filed: Aug. 10, 2022

(65) Prior Publication Data

US 2023/0048476 A1 Feb. 16, 2023

Related U.S. Application Data

(60) Provisional application No. 63/231,818, filed on Aug. 11, 2021.

(51) Int. Cl.
*H03H 9/25* (2006.01)
*H03H 9/145* (2006.01)

(52) U.S. Cl.
CPC .......... *H03H 9/14541* (2013.01); *H03H 9/25* (2013.01)

(58) Field of Classification Search
CPC ........................... H03H 9/14541; H03H 9/25
USPC ...... 310/313 R, 313 A, 313 B, 313 C, 313 D
See application file for complete search history.

(56) References Cited

U.S. PATENT DOCUMENTS

| | | | |
|---|---|---|---|
| 6,380,827 B1 * | 4/2002 | Noguchi | H03H 9/6483 333/195 |
| 2012/0133246 A1 * | 5/2012 | Yaoi | H03H 9/131 310/313 C |
| 2019/0379346 A1 | 12/2019 | Wasaki et al. | |

FOREIGN PATENT DOCUMENTS

WO WO-2010131737 A1 * 11/2010 ......... H03H 9/14541

* cited by examiner

*Primary Examiner* — Derek J Rosenau
(74) *Attorney, Agent, or Firm* — Lando & Anastasi, LLP

(57) ABSTRACT

A surface acoustic wave device includes a piezoelectric substrate and a multi-layer interdigital transducer electrode disposed on the piezoelectric substrate. The multi-layer interdigital transducer electrode includes a first electrode layer and a second electrode layer. The second electrode layer is disposed between the piezoelectric substrate and the first electrode layer. The first electrode layer has a higher density than a density of the second electrode layer. The second electrode layer has a higher conductivity than a conductivity of the first electrode layer. Related radio frequency modules and wireless communication devices are also provided.

23 Claims, 7 Drawing Sheets

EXAMPLE B ————
EXAMPLE C – – – –
EXAMPLE A ————
EXAMPLE F —·—·—

EXAMPLE B ————
EXAMPLE C – – – –
EXAMPLE A ————
EXAMPLE F —·—·—

EXAMPLE E ————
EXAMPLE C – – – –
EXAMPLE A ————
EXAMPLE F —·—·—

EXAMPLE E ————
EXAMPLE C – – – –
EXAMPLE A ————
EXAMPLE F —·—·—

EXAMPLE D ————
EXAMPLE C ——––
EXAMPLE A ————
EXAMPLE F ———–

EXAMPLE D ————
EXAMPLE C ——––
EXAMPLE A ————
EXAMPLE F ———–

SURFACE ACOUSTIC WAVE DEVICE COMPRISING MULTI-LAYER INTERDIGITAL TRANSDUCER ELECTRODE

CROSS-REFERENCE TO RELATED APPLICATIONS

This application claims priority under 35 U.S.C. § 119(e) to U.S. Provisional Patent Application Ser. No. 63/231,818, titled "SURFACE ACOUSTIC WAVE DEVICE COMPRISING MULTI-LAYER INTERDIGITAL TRANSDUCER ELECTRODE," filed Aug. 11, 2021, the entire contents of which is incorporated herein by reference for all purposes.

BACKGROUND

Field

Aspects and embodiments disclosed herein relate to surface acoustic wave devices. More particularly, at least some embodiments are directed to radio frequency modules and wireless communication devices having surface acoustic wave devices.

Description of the Related Technology

A surface acoustic wave filter can include a plurality of resonators arranged to filter a radio frequency signal. Each resonator can include a surface acoustic wave (SAW) device. The SAW device comprises a plurality of electrodes arranged as interleaved fingers on top of a piezoelectric substrate and attached to one or more busbars linking a subset of the electrodes together. The SAW device generates acoustic waves which propagate across the piezoelectric substrate between the electrodes. Surface acoustic wave filters can be implemented in radio frequency electronic systems. For instance, filters in a radio frequency front end of a mobile phone can include surface acoustic wave filters.

SUMMARY

According to one embodiment, there is provided a surface acoustic wave device including a piezoelectric substrate and a multi-layer interdigital transducer electrode disposed on the piezoelectric substrate. The multi-layer interdigital transducer electrode includes a first electrode layer and a second electrode layer. The second electrode layer is disposed between the piezoelectric substrate and the first electrode layer. The first electrode layer has a higher density than a density of the second electrode layer. The second electrode layer has a higher conductivity than a conductivity of the first electrode layer.

In one example the first electrode layer is made mainly of tungsten.

In one example the first electrode layer has a thickness of between 100 nanometers and 500 nanometers. The first electrode layer may have a thickness of between 300 nanometers and 500 nanometers. The first electrode layer may have a thickness of 400 nanometers.

In one example the first electrode layer has a density of at least 10 grams per cubic centimeter. In one example the first electrode layer has a density of at least 19 grams per cubic centimeter.

In one example the first electrode layer is the uppermost layer of the multi-layer interdigital transducer electrode.

In one example the second electrode layer is made mainly of copper.

In one example the second electrode layer has a conductivity of at least $4\times10^7$ Siemens per meter. In one example the second electrode layer has a conductivity of at least $5\times10^7$ Siemens per meter. In one example the second electrode layer has a conductivity of at least $5.9\times10^7$ Siemens per meter.

In one example the second electrode layer has a thickness of between 100 nanometers and 500 nanometers. The second electrode layer may have a thickness of between 100 nanometers and 300 nanometers. The second electrode layer may have a thickness of 200 nanometers.

In one example the first electrode layer has a greater thickness than a thickness of the second electrode layer. The thickness of the first electrode layer may be at least two times higher than the thickness of the second electrode layer.

In one example the first electrode layer has a thickness that is substantially the same as a thickness of the second electrode layer.

In one example the second electrode layer has an upper surface in contact with a lower surface of the first electrode layer.

In one example the second electrode layer has a lower surface in contact with an upper surface of the piezoelectric substrate.

In one example the difference between a coefficient of thermal expansion of the second electrode layer and a coefficient of thermal expansion of the first electrode layer is no more than 18 ppm/degree K. The difference between a coefficient of thermal expansion of the second electrode layer and a coefficient of thermal expansion of the first electrode layer may be no more than 15 ppm/degree K. The difference between a coefficient of thermal expansion of the second electrode layer and a coefficient of thermal expansion of the first electrode layer may be no more than 13 ppm/degree K.

In one example the multi-layer interdigital transducer electrode further includes a third electrode layer disposed between the piezoelectric substrate and the second electrode layer.

In one example the third electrode layer is made mainly of tungsten. In one example the third electrode layer is made mainly of titanium.

In one example the third electrode layer has an upper surface in contact with a lower surface of the second electrode layer.

In one example the third electrode layer has a lower surface in contact with an upper surface of the piezoelectric substrate.

In one example the third electrode layer has a density of at least 10 grams per cubic centimeter. In one example the third electrode layer has a density of at least 19 grams per cubic centimeter.

In one example the third electrode layer has a higher density than the density of the second electrode layer.

In one example the third electrode layer has a lower conductivity than the conductivity of the second electrode layer.

In one example the third electrode layer is made mainly of the same material as a material forming the first electrode layer.

In one example the difference between a coefficient of thermal expansion of the second electrode layer and a coefficient of thermal expansion of the third electrode layer is no more than 18 ppm/degree K. The difference between a coefficient of thermal expansion of the second electrode layer and a coefficient of thermal expansion of the first electrode layer may be no more than 15 ppm/degree K. The difference between a coefficient of thermal expansion of the second electrode layer and a coefficient of thermal expansion of the first electrode layer may be no more than 13 ppm/degree K In one example the multi-layer interdigital transducer electrode further includes an adhesion layer disposed between the piezoelectric substrate and the second electrode layer. Where the multi-layer interdigital transducer electrode further includes a third electrode layer disposed between the piezoelectric substrate and the second electrode layer, the adhesion layer may be disposed between the piezoelectric substrate and the third electrode layer.

The adhesion layer may have a thickness of less than 30 nanometers. The adhesion layer may have a thickness of less than 20 nanometers. The adhesion layer may have a thickness of less than 15 nanometers. The adhesion layer may have a thickness of less than 10 nanometers.

In one example the adhesion layer is made mainly of titanium.

In one example the multi-layer interdigital transducer electrode further includes a fourth electrode layer disposed between the piezoelectric substrate and the third electrode layer. The fourth layer may be the adhesion layer recited above. The adhesion layer may be referred to as an etch stop layer.

In one example the surface acoustic wave device further includes a layer of dielectric material disposed on an upper surface of the piezoelectric substrate and an upper surface of the multi-layer interdigital transducer electrode.

The multi-layer interdigital transducer electrode may include plural electrode fingers disposed on the piezoelectric substrate. Where the surface acoustic wave device further includes a layer of dielectric material disposed on an upper surface of the piezoelectric substrate and an upper surface of the multi-layer interdigital transducer electrode, the layer of dielectric material may be free of voids between the fingers of the multi-layer interdigital transducer electrode.

Each upper surface and each lower surface of each electrode layer of the multi-layer interdigital transducer electrode described herein may be substantially parallel with the upper surface of the substrate.

According to another embodiment, there is provided a wafer-level package that includes a piezoelectric substrate and a multi-layer interdigital transducer electrode disposed on the piezoelectric substrate. The multi-layer interdigital transducer electrode includes a first electrode layer and a second electrode layer. The second electrode layer is disposed between the piezoelectric substrate and the first electrode layer. The first electrode layer has a higher density than a density of the second electrode layer. The second electrode layer has a higher conductivity than a conductivity of the first electrode layer.

The wafer-level package may include one or more suitable features of any of the surface acoustic wave devices discussed herein.

According to another embodiment, there is provided a radio frequency module including a power amplifier configured to provide a radio frequency signal, and a surface acoustic wave filter configured to filter the radio frequency signal. The surface acoustic wave filter includes a piezoelectric substrate and a multi-layer interdigital transducer electrode disposed on the piezoelectric substrate. The multi-layer interdigital transducer electrode includes a first electrode layer and a second electrode layer. The second electrode layer is disposed between the piezoelectric substrate and the first electrode layer. The first electrode layer has a higher density than a density of the second electrode layer.

The second electrode layer has a higher conductivity than a conductivity of the first electrode layer.

The radio frequency module may include one or more suitable features of any of the surface acoustic wave devices discussed herein.

According to another embodiment, there is provided a wireless communication device including a surface acoustic wave filter configured to provide a filtered radio frequency signal. The surface acoustic wave filter includes a piezoelectric substrate and a multi-layer interdigital transducer electrode disposed on the piezoelectric substrate. The multi-layer interdigital transducer electrode includes a first electrode layer and a second electrode layer. The second electrode layer is disposed between the piezoelectric substrate and the first electrode layer. The first electrode layer has a higher density than a density of the second electrode layer. The second electrode layer has a higher conductivity than a conductivity of the first electrode layer.

The wireless communication device may include one or more suitable features of any of the surface acoustic wave devices discussed herein.

Still other aspects, embodiments, and advantages of these exemplary aspects and embodiments are discussed in detail below. Embodiments disclosed herein may be combined with other embodiments in any manner consistent with at least one of the principles disclosed herein, and references to "an embodiment," "some embodiments," "an alternate embodiment," "various embodiments," "one embodiment" or the like are not necessarily mutually exclusive and are intended to indicate that a particular feature, structure, or characteristic described may be included in at least one embodiment. The appearances of such terms herein are not necessarily all referring to the same embodiment.

BRIEF DESCRIPTION OF THE DRAWINGS

Various aspects of at least one embodiment are discussed below with reference to the accompanying figures, which are not intended to be drawn to scale. The figures are included to provide illustration and a further understanding of the various aspects and embodiments, and are incorporated in and constitute a part of this specification, but are not intended as a definition of the limits of the invention. In the figures, each identical or nearly identical component that is illustrated in various figures is represented by a like numeral. For purposes of clarity, not every component may be labeled in every figure. In the figures.

DETAILED DESCRIPTION

Aspects and embodiments described herein are directed to a surface acoustic wave (SAW) device having a multi-layer interdigital transducer electrode disposed on a piezoelectric substrate.

It is to be appreciated that embodiments of the methods and apparatuses discussed herein are not limited in application to the details of construction and the arrangement of components set forth in the following description or illustrated in the accompanying drawings. The methods and apparatuses are capable of implementation in other embodiments and of being practiced or of being carried out in various ways. Examples of specific implementations are provided herein for illustrative purposes only and are not intended to be limiting. Also, the phraseology and terminology used herein is for the purpose of description and should not be regarded as limiting. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms.

Figure 1A:
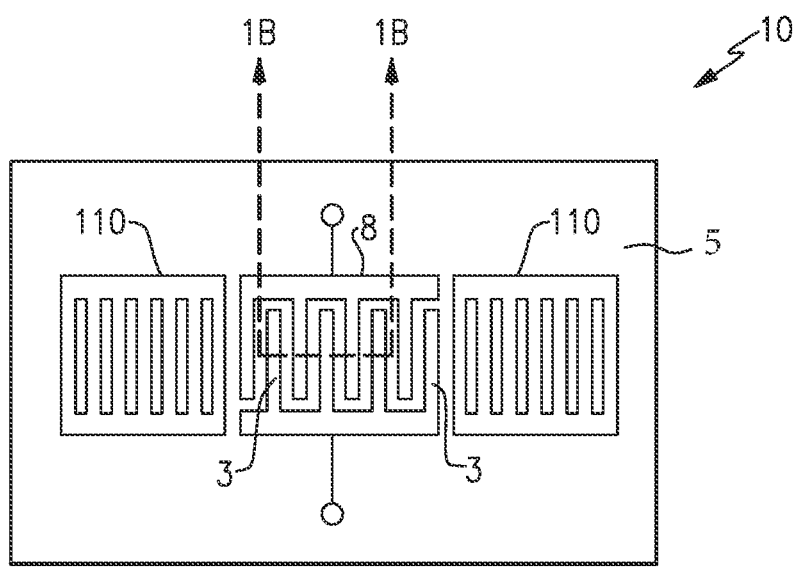
FIG. 1A is a plan view of an exemplary conventional surface acoustic wave device.
Figure 1B:
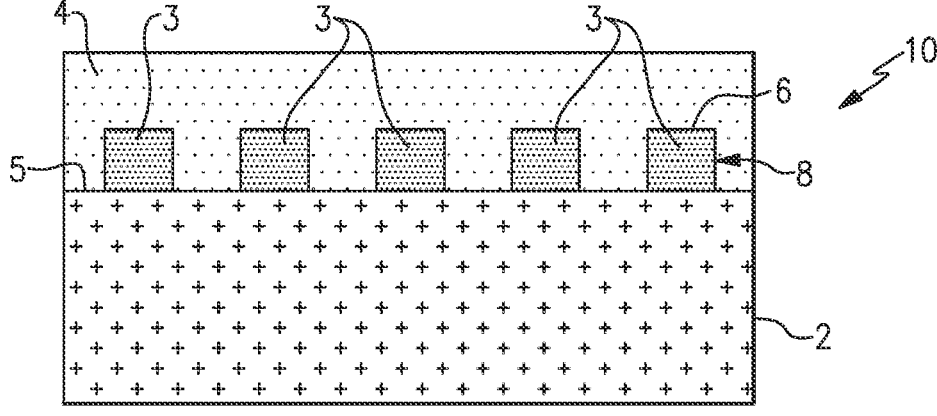
FIG. 1B is a schematic cross-sectional view of the conventional surface acoustic wave device at line 1B-1B shown in FIG. 1A.

FIG. 1A is a schematic plan view of an exemplary conventional SAW resonator device 10. FIG. 1B is a schematic cross-sectional view of the SAW resonator device 10 at line 1B-1B shown in FIG. 1A. The SAW resonator 10 includes a piezoelectric substrate 2 carrying an interdigital transducer (IDT) electrode 8. The IDT electrode 8 is disposed on the piezoelectric substrate 2 such that the IDT electrode 8 is in contact with an upper surface 5 of the piezoelectric substrate 2. The piezoelectric substrate 2 may be a lithium niobate (LiNbO$_3$) based substrate.

The IDT electrode 8 is a comb-shaped electrode having plural electrode fingers 3 disposed on the upper surface 5 of the piezoelectric substrate 2. Electrode fingers 3 are configured to excite a surface wave, such as Rayleigh wave, as a main acoustic wave. The conventional SAW resonator 10 of FIGS. 1A and 1B may typically have 10 to 15 or more reflector fingers in each of the reflector gratings 110, with each finger separated by a distance equal to half the wavelength of a surface acoustic wave generated by the IDT 8.

The SAW resonator device 10 also includes a dielectric film 4 disposed above upper surface 5 of the piezoelectric substrate 2 to cover plural electrode fingers 3. The dielectric film 4 is therefore in contact with the upper surface 5 of the piezoelectric substrate 2 and also in contact with the upper surface 6 of plural electrode fingers 3. The dielectric film 4 may be made of oxide, such as silicon dioxide (SiO$_2$).

To minimize losses in a SAW device, such as the SAW resonator of FIG. 1A and FIG. 1B it can be desirable for the material of the IDT electrode to be hard and dense. It can therefore be desirable to make the IDT electrode from dense metals like tungsten or molybdenum due to their hardness properties. In particular, the density of such metals can make it possible to shrink the size of the die being used, while minimizing viscous losses in the SAW device.

However, the resistivity of such metals is relatively high thereby making such metals less suitable for electrical conductance. One solution to this problem is to add an aluminum layer on top of a base layer of tungsten or molybdenum when forming the IDT electrode. The lower layer of tungsten or molybdenum can provide desirable hardness and density properties to the IDT electrode, while the upper layer of aluminum can increase the overall electrical conductivity of IDT electrode.

It has been appreciated by the present inventors that, while an upper layer of aluminum can increase conductivity for the IDT electrode, pure aluminum still has a relatively low tensile and compressive strength. Consequently, even with a two layer aluminum and tungsten IDT electrode structure, the IDT electrode could still benefit from improved torsional and bending rigidity, and potentially even improved conductance.

As will become apparent from the following description and the information presented by accompanying FIGS. 2A to 2F, 3A, 3B, 4A, 4B, 5A, and 5B, embodiments of the present invention concern novel and improved multilayer IDT electrodes, which are both hard and rigid while also highly conductive, to thereby minimize both resistive loss and viscous loss. In general, the present inventors have found that such improvements can be obtained when providing the multilayer IDT electrode with an upper layer that is denser than a lower, yet more conductive layer, such as is shown by Examples A, B, D and E of FIG. 2A, FIG. 2B, FIG. 2D, and FIG. 2E.

The present inventors have also identified copper as a particularly desirable metal to bring conductivity properties to the IDT electrode. Since copper is about three times as dense as pure aluminum, forming a layer of the IDT electrode from copper, as opposed to aluminum, can improve the overall density and hardness of the IDT electrode. Copper is also more conductive than aluminum and so also improves the electrical conductance of the IDT electrode. In particular, the resistivity of copper is generally about $1.7 \times 10^{-8}$ ohm meters, whereas the resistivity of aluminum is generally about $2.7 \times 10^{-8}$ ohm meters.

The present inventors have also identified the combination of a copper layer with a tungsten layer as being particularly desirable combination to utilize in the multilayer IDT electrode. This is at least partly due to the closer thermal match that copper has with tungsten as compared to aluminum. This may help with heat dissipation and other thermal factors for the IDT electrode.

Improvements have also been identified when arranging for the multilayer IDT electrode to be formed of at least three layers, with a second layer being sandwiched between a first layer and a third layer, and where the second (middle) layer is formed of a material that is more conductive, yet less dense than the material(s) forming the first layer and the third layer. For example, as is shown by Examples B, D and E of FIG. 2B, FIG. 2D and FIG. 2E, it can be desirable for the multilayer IDT electrode to be formed of three layers, with a copper layer being sandwiched between a layer of tungsten and a layer of tungsten or titanium. With such arrangements, the top and bottom layers of the sandwich structure may take the majority of the compressive and tensile loads when the multilayer IDT electrode is perturbed.

Figure 2A:
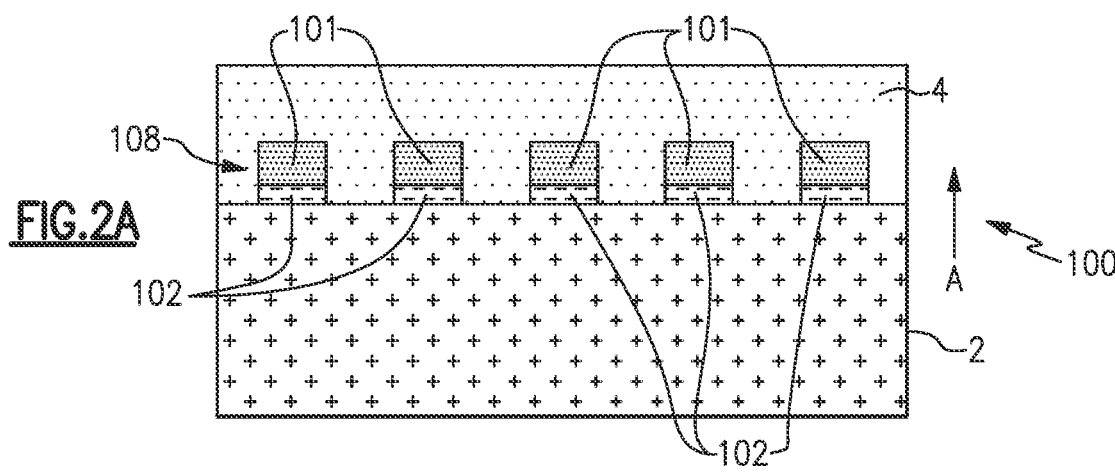
FIG. 2A is a schematic cross-sectional view of a surface acoustic wave device according to aspects of the present invention.

FIG. 2A shows a schematic cross-sectional view of a surface acoustic wave (SAW) device 100 according to a first embodiment of the present invention (hereinafter referred to as "Example A"). The SAW device 100 includes a piezoelectric substrate 2 carrying a multilayer interdigital transducer (IDT) electrode 108. The multilayer IDT electrode 108 includes a first electrode layer 101 made of tungsten and a second electrode layer 102 made of copper. The second electrode layer 102 is disposed between the piezoelectric substrate 2 and the first electrode layer 101. In particular, the second electrode layer 102 has an upper surface in contact with a lower surface of the first electrode layer 101. The second electrode layer 102 also has a lower surface in contact with an upper surface of the piezoelectric substrate 2. In the first embodiment of the present invention shown in FIG. 2A, the first electrode layer 101 is the uppermost layer of the multilayer IDT electrode 108. The first electrode layer 101 may have a thickness of 400 nanometers in direction A. The second electrode layer 102 may have a thickness of 200 nanometers in direction A.

Figure 2B:
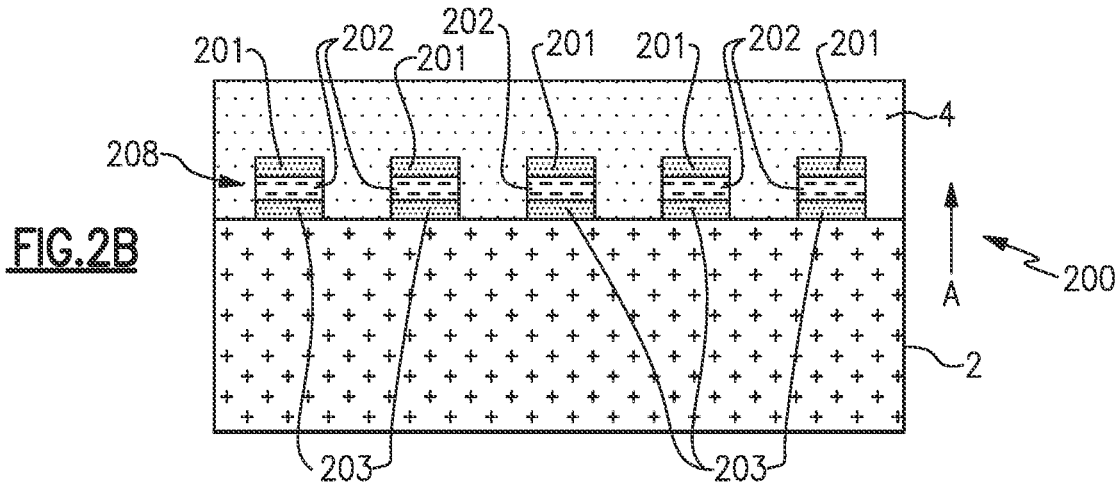
FIG. 2B is a schematic cross-sectional view of a surface acoustic wave device according to aspects of the present invention.

FIG. 2B shows a schematic cross-sectional view of a surface acoustic wave (SAW) device 200 according to a second embodiment of the present invention (hereinafter referred to as "Example B"). The SAW device 200 includes a piezoelectric substrate 2 carrying a multilayer interdigital transducer (IDT) electrode 208. The multilayer IDT electrode 208 includes a first electrode layer 201 made of tungsten and a second electrode layer 202 made of copper. The second electrode layer 202 is disposed between the piezoelectric substrate 2 and the first electrode layer 201. In particular, the second electrode layer 202 has an upper surface in contact with a lower surface of the first electrode layer 201.

The multilayer IDT electrode 208 of Example B also includes a third electrode layer 203 disposed between the piezoelectric substrate 2 and the second electrode layer 202. The third electrode layer 203 is made of tungsten. The third electrode layer 203 has a lower surface in contact with an upper surface of the piezoelectric substrate 2. The third electrode layer 203 also has an upper surface in contact with a lower surface of the second electrode layer 202. The multilayer IDT electrode 208 of Example B therefore consists of three layers. The first electrode layer 201 has a thickness of 200 nanometers in direction A. The second electrode layer 202 may have a thickness of 200 nanometers in direction A. The third electrode layer 203 may have a thickness of 200 nanometers in direction A.

Figure 2C:
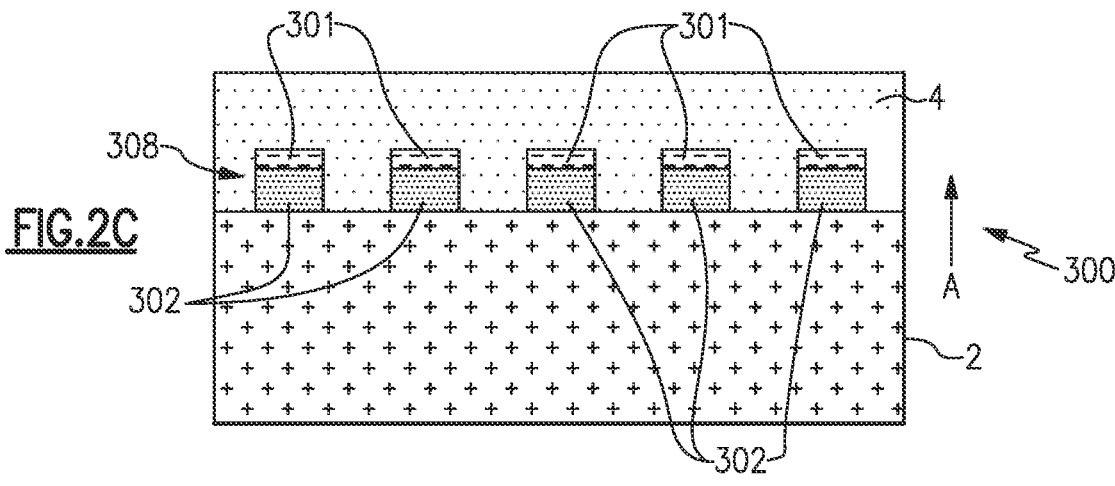
FIG. 2C is a schematic cross-sectional view of an example surface acoustic wave device.

FIG. 2C shows a schematic cross-sectional view of a first example surface acoustic wave (SAW) device 300 (hereinafter referred to as "Example C"). The SAW device 300 includes a piezoelectric substrate 2 carrying a multilayer interdigital transducer (IDT) electrode 308. The multilayer IDT electrode 308 includes a first electrode layer 301 made of copper and a second electrode layer 302 made of tungsten. The second electrode layer 302 is disposed between the piezoelectric substrate 2 and the first electrode layer 301. In particular, the second electrode layer 302 has an upper surface in contact with a lower surface of the first electrode layer 301. The second electrode layer 302 also has a lower surface in contact with an upper surface of the piezoelectric substrate 2. In Example C, the first electrode layer 301 is the uppermost layer of the multilayer IDT electrode 308. The first electrode layer 301 may have a thickness of 200 nanometers in direction A. The second electrode layer 302 may have a thickness of 400 nanometers in direction A.

Figure 2D:
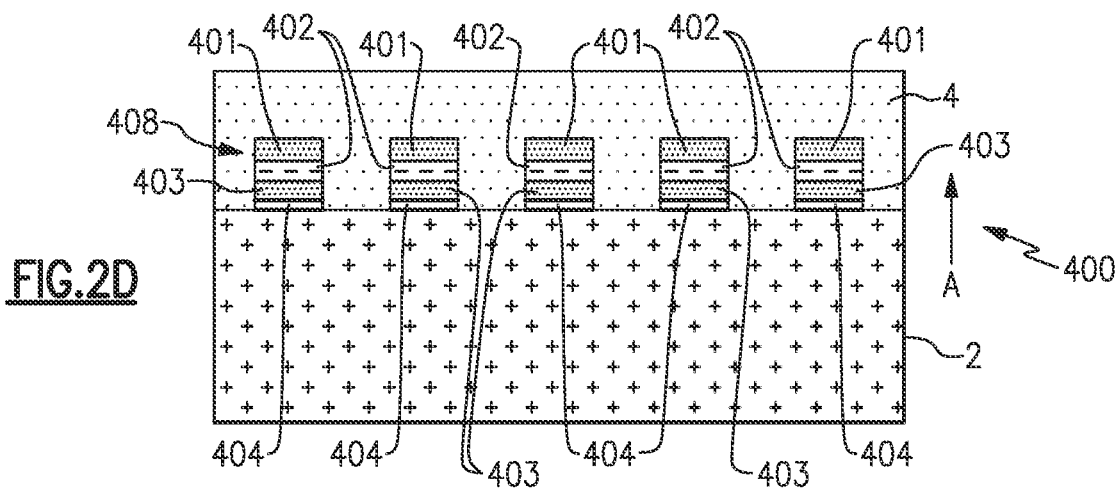
FIG. 2D is a schematic cross-sectional view of a surface acoustic wave device according to aspects of the present invention.

FIG. 2D shows a schematic cross-sectional view of a surface acoustic wave (SAW) device 400 according to a third embodiment of the present invention (hereinafter referred to as "Example D"). The SAW device 400 includes a piezoelectric substrate 2 carrying a multilayer interdigital transducer (IDT) electrode 408. The multilayer IDT electrode 408 includes a first electrode layer 401 and a second electrode layer 402. The second electrode layer 402 is disposed between the piezoelectric substrate 2 and the first electrode layer 401. In particular, the second electrode layer 402 has an upper surface in contact with a lower surface of the first electrode layer 401.

The multilayer IDT electrode 408 of Example D also includes a third electrode layer 403 disposed between the piezoelectric substrate 2 and the second electrode layer 402. The third electrode layer 403 has an upper surface in contact with a lower surface of the second electrode layer 402. The third electrode layer 403 is made of tungsten.

The multilayer IDT electrode 408 of Example D also includes a fourth electrode layer 404 disposed between the piezoelectric substrate 2 and the third electrode layer 403. The fourth electrode layer 404 has a lower surface in contact with an upper surface of the piezoelectric substrate 2. The fourth electrode layer 404 has an upper surface in contact with a lower surface of the third electrode layer 403. The fourth electrode layer 404 is made of titanium. The fourth electrode layer 404 may act as an adhesion layer to assist with securing the multilayer IDT electrode 408 to the piezoelectric substrate 2.

The multilayer IDT electrode 408 of Example D therefore consists of four layers. The first electrode layer 401 may have a thickness of 200 nanometers in direction A. The second electrode layer 402 may have a thickness of 200 nanometers in direction A. The third electrode layer 403 may have a thickness of 200 nanometers in direction A. The fourth electrode layer 404 may have a thickness of 15 nanometers in direction A. The above specified thickness values for the first, second, third and fourth layers 401, 402, 403 and 404 are merely exemplary values, and other suitable thicknesses may be adopted based on the desired properties of the multilayer IDT electrode 408.

Figure 2E:
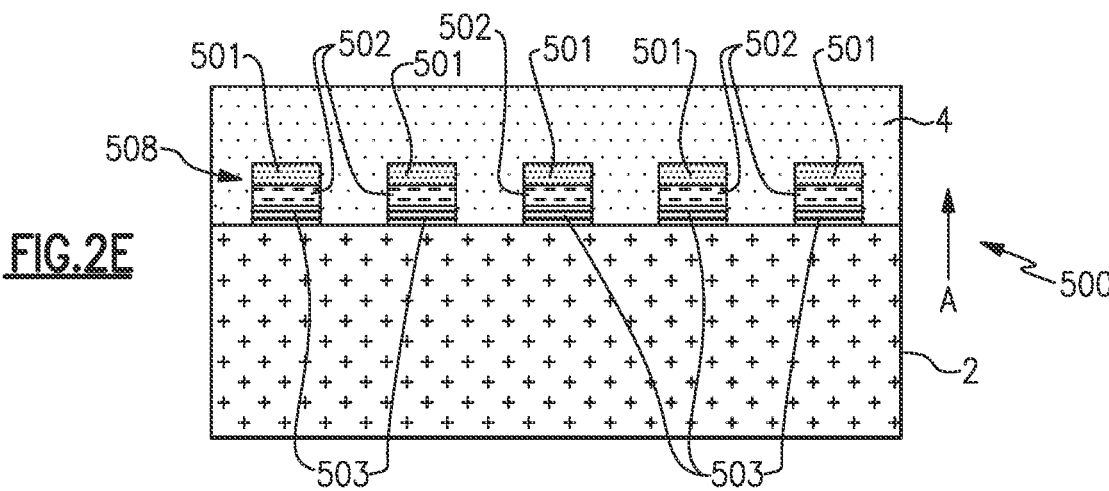
FIG. 2E is a schematic cross-sectional view of a surface acoustic wave device according to aspects of the present invention.

FIG. 2E shows a schematic cross-sectional view of a surface acoustic wave (SAW) device 500 according to a fourth embodiment of the present invention (hereinafter referred to as "Example E"). The SAW device 500 includes a piezoelectric substrate 2 carrying a multilayer interdigital transducer (IDT) electrode 508. The multilayer IDT electrode 508 includes a first electrode layer 501 made of tungsten and a second electrode layer 502 made of copper. The second electrode layer 502 is disposed between the piezoelectric substrate 2 and the first electrode layer 501. In particular, the second electrode layer 502 has an upper surface in contact with a lower surface of the first electrode layer 501.

The multilayer IDT electrode 508 of Example E also includes a third electrode layer 503 disposed between the piezoelectric substrate 2 and the second electrode layer 502. The third electrode layer 503 is made of titanium. The third electrode layer 503 has a lower surface in contact with an upper surface of the piezoelectric substrate 2. The third electrode layer 503 also has an upper surface in contact with a lower surface of the second electrode layer 502. The multilayer IDT electrode 508 of Example E therefore consists of three layers. The first electrode layer 501 may have a thickness of 200 nanometers in direction A. The second electrode layer 502 may have a thickness of 200 nanometers in direction A. The third electrode layer 503 may have a thickness of 200 nanometers in direction A.

Figure 2F:
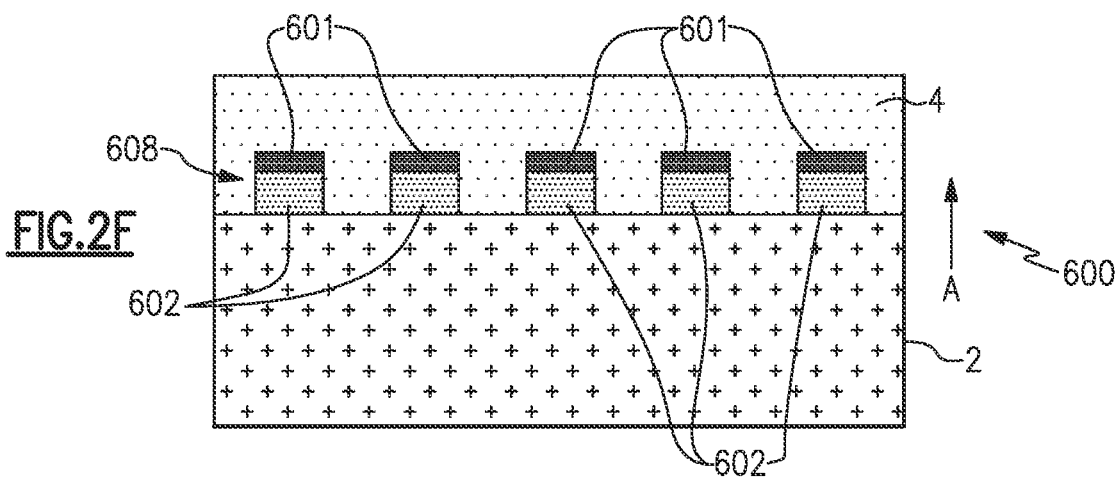
FIG. 2F is a schematic cross-sectional view of another example surface acoustic wave device.

FIG. 2F shows a schematic cross-sectional view of a second example surface acoustic wave (SAW) device 600 (hereinafter referred to as "Example F"). The SAW device 600 includes a piezoelectric substrate 2 carrying a multilayer interdigital transducer (IDT) electrode 608. The multilayer IDT electrode 608 includes a first electrode layer 601 made of aluminum and a second electrode layer 602 made of tungsten. The second electrode layer 602 is disposed between the piezoelectric substrate 2 and the first electrode layer 601. In particular, the second electrode layer 602 has an upper surface in contact with a lower surface of the first electrode layer 601. The second electrode layer 602 also has a lower surface in contact with an upper surface of the piezoelectric substrate 2. In Example F, the first electrode layer 601 is the uppermost layer of the multilayer IDT electrode 608. The first electrode layer 601 may have a thickness of 200 nanometers in direction A. The second electrode layer 602 may have a thickness of 400 nanometers in direction A.

Figures 3A, 3B, 4A, 4B:
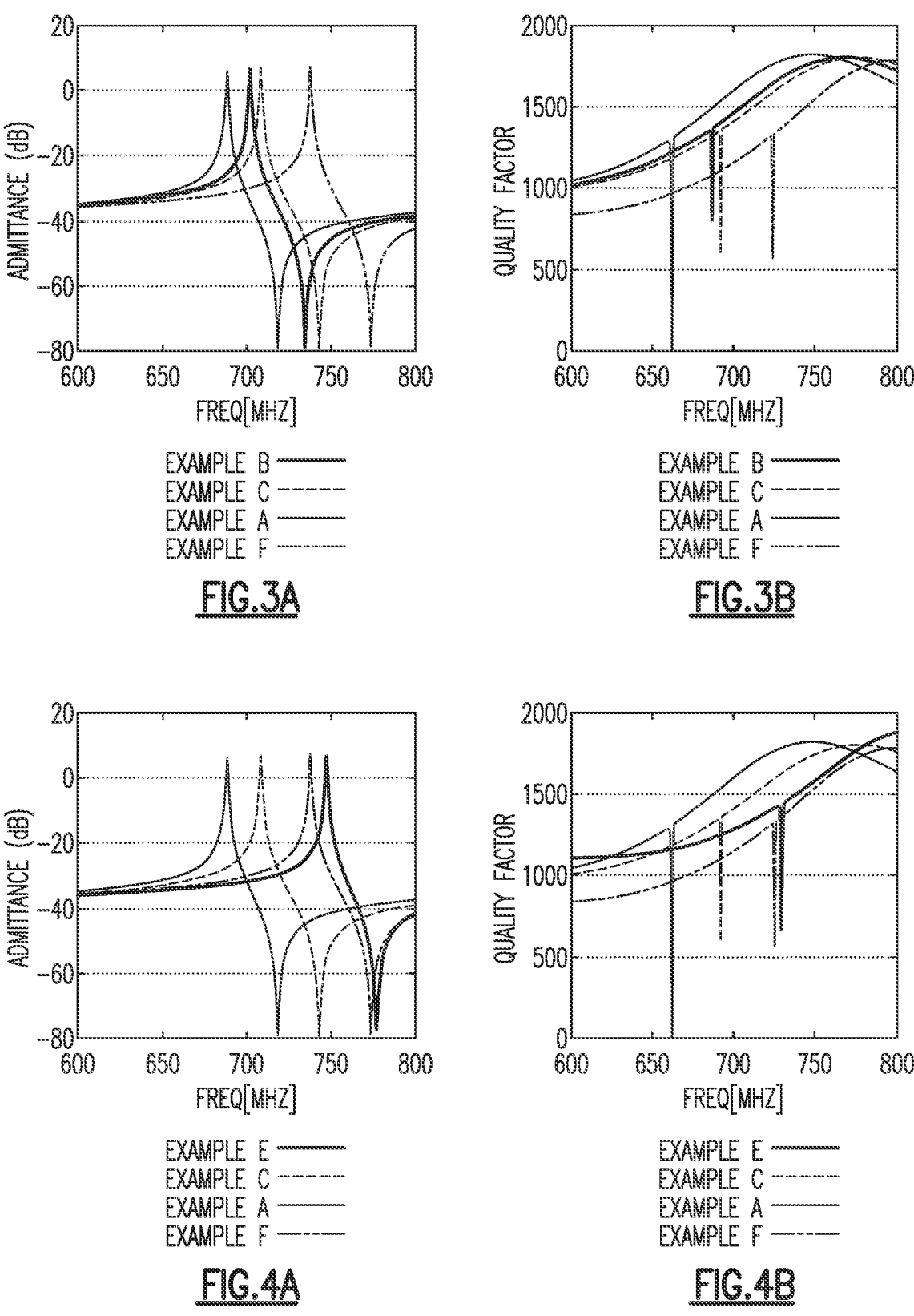
FIG. 3A is a graph showing admittance plotted against frequency for the surface acoustic wave devices of FIGS. 2A, 2B, 2C and 2F.
FIG. 3B is a graph showing quality factor plotted against frequency for the surface acoustic wave devices of FIGS. 2A, 2B, 2C and 2F.
FIG. 4A is a graph showing admittance plotted against frequency for the surface acoustic wave devices of FIGS. 2A, 2C, 2E and 2F.
FIG. 4B is a graph showing quality factor plotted against frequency for the surface acoustic wave devices of FIGS. 2A, 2C, 2E and 2F.
Figures 5A, 5B:
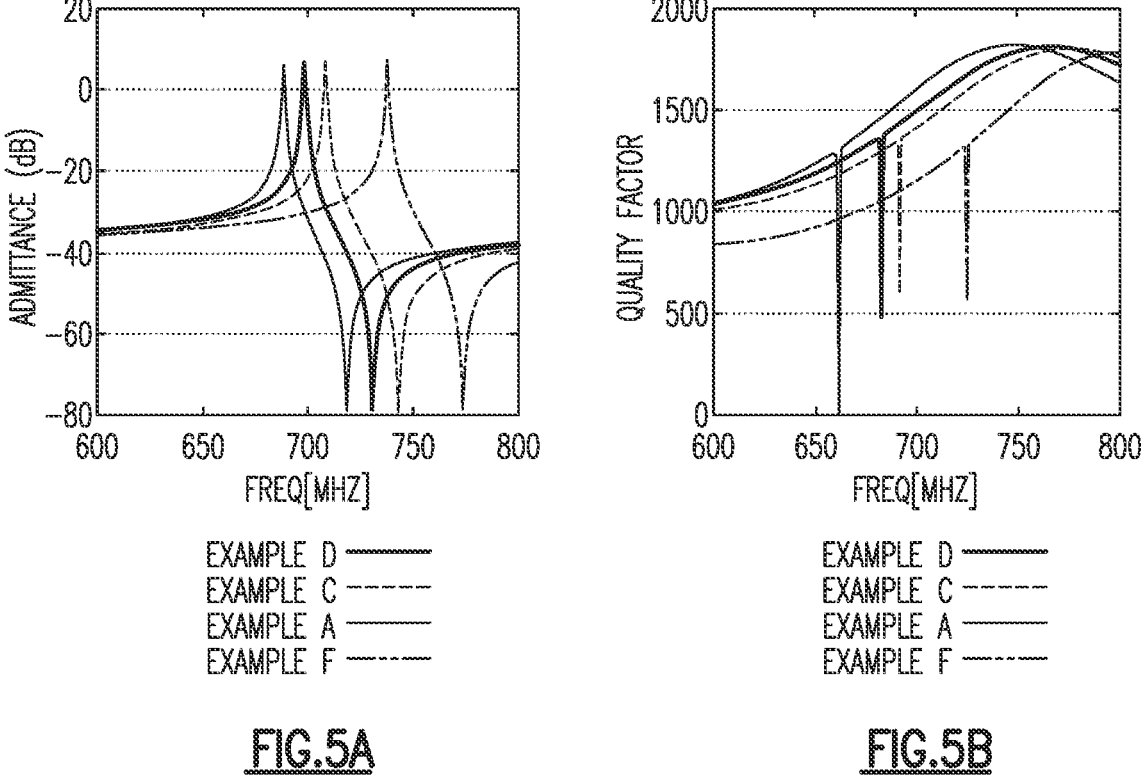
FIG. 5A is a graph showing admittance plotted against frequency for the surface acoustic wave devices of FIGS. 2A, 2C, 2D and 2F.
FIG. 5B is a graph showing quality factor plotted against frequency for the surface acoustic wave devices of FIGS. 2A, 2C, 2D and 2F.

FIGS. 3A, 4A and 5A show various comparisons of admittance plotted against frequency for the surface acoustic wave devices of Examples A, B, C, D, E and F. FIGS. 3B, 4B and 5B show various comparisons of quality factor plotted against frequency for the surface acoustic wave devices of Examples A, B, C, D, E and F. Advantages concerning Examples A, B, D, and E, in particular, will be readily understood by one of skill in the art when having regard to FIGS. 3A, 3B, 4A, 4B, 5A and 5B and the above description.

It should be appreciated that the surface acoustic wave resonators illustrated in FIGS. 2A to 2F, as well as the other circuit elements illustrated in other figures presented herein, are illustrated in a highly simplified form. The relative dimensions of the different features are not shown to scale. Further, typical surface acoustic wave resonators would commonly include a far greater number of electrode fingers in the IDTs than illustrated. Similarly, the number of reflector fingers shown in FIGS. 1A, 1B and FIGS. 2A to 2F (described below) are not intended to be representative of the number of reflector fingers included within the reflector gratings, which is instead described in the text of the description.

The surface acoustic wave devices and/or multi-layer interdigital transducer electrodes described herein can be included in a wafer-level package. A wafer-level package refers to a integrated circuit that is packaged while still part of a wafer, as opposed to separating the wafer into individual dies and packaging each die separately. The resulting wafer-level package is a chip-scale package because the package is the same size as, or only marginally larger than, the size of the die. The integrated circuit can include a SAW device.

The surface acoustic wave devices described herein can be included in a filter. A filter that includes one or more surface acoustic wave devices can be referred to as a surface acoustic wave filter. Surface acoustic wave devices can be arranged as series resonators and shunt resonators to form a ladder filter. In some instances, a filter can include surface acoustic wave resonators and one or more other resonators (e.g., one or more other bulk acoustic wave resonators).

Figure 6:
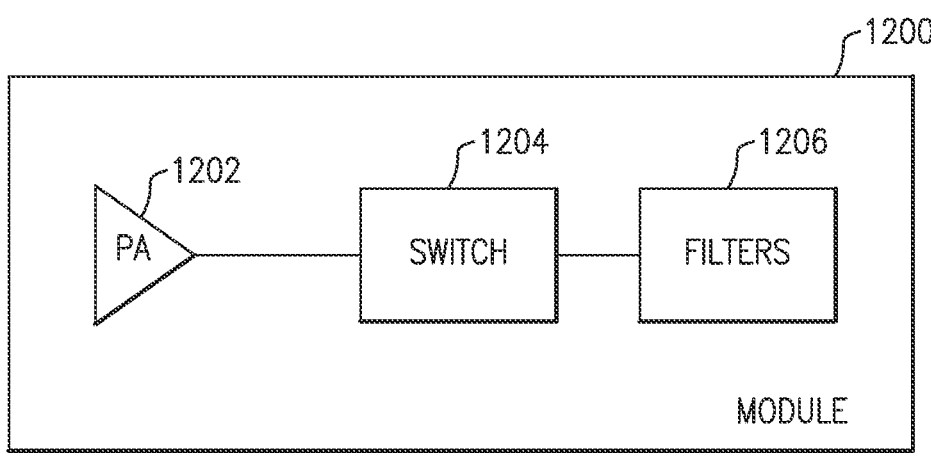
FIG. 6 is a schematic block diagram of a module that includes a power amplifier, a switch, and filters according to aspects of the present invention.
Figure 7:
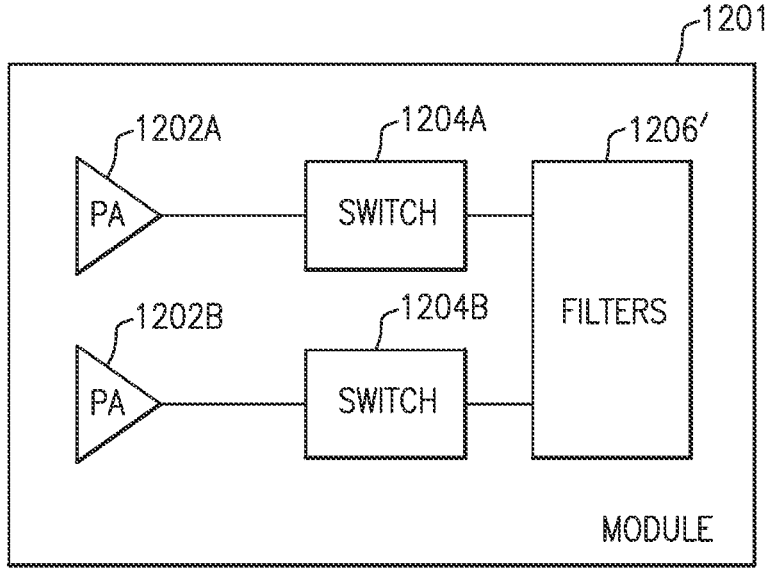
FIG. 7 is a schematic block diagram of a module that includes power amplifiers, switches, and filters according to aspects of the present invention.
Figure 8:
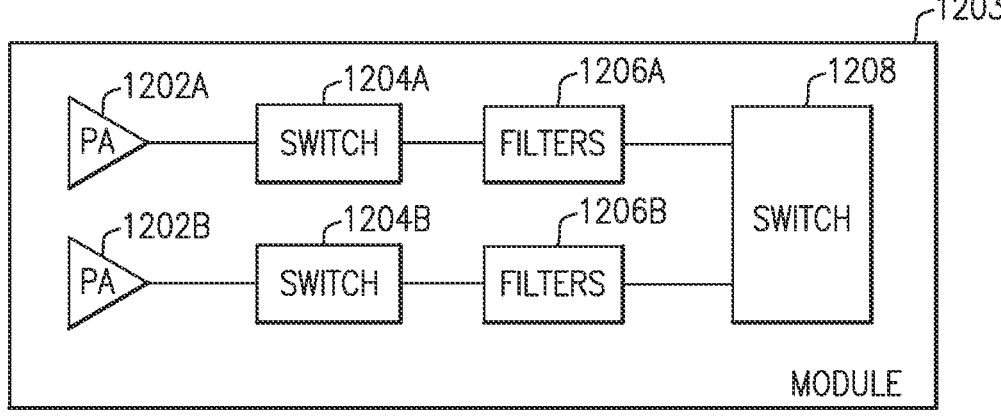
FIG. 8 is a schematic block diagram of a module that includes power amplifiers, switches, filters according to aspects of the present invention, and an antenna switch.

The filters discussed herein can be implemented in a variety of modules. Some example modules will now be discussed in which any suitable principles and advantages of the filters discussed herein can be implemented. FIGS. 6, 7, and 8 are schematic block diagrams of illustrative modules according to certain embodiments. A module arranged to process a radio frequency signal can be referred to as a radio frequency (RF) module.

Surface acoustic wave devices can be included in a filter. A filter that includes one or more surface acoustic wave devices can be referred to as a surface acoustic wave filter. Surface acoustic wave devices can be arranged as series resonators and shunt resonators to form a ladder filter. In some instances, a filter can include surface acoustic wave resonators and one or more other resonators (e.g., one or more other bulk acoustic wave resonators).

The filters discussed herein can be implemented in a variety of modules. Some example modules will now be discussed in which any suitable principles and advantages of the filters discussed herein can be implemented. FIGS. 6, 7, and 8 are schematic block diagrams of illustrative modules according to certain embodiments. A module arranged to process a radio frequency signal can be referred to as a radio frequency (RF) module.

FIG. 6 is a schematic block diagram of a module 1200 that includes a power amplifier 1202, a switch 1204, and filters 1206 in accordance with one or more embodiments. The module 1200 can include a package that encloses the illustrated elements. The power amplifier 1202, the switch 1204, and the filters 1206 can be disposed on a common packaging substrate. The packaging substrate can be a laminate substrate, for example. The power amplifier 1202 can amplify a radio frequency signal. The power amplifier 1202 can include a gallium arsenide bipolar transistor in certain applications. The switch 1204 can be a multi-throw radio frequency switch. The switch 1204 can electrically couple an output of the power amplifier 1202 to a selected filter of the filters 1206. The filters 1206 can include any suitable number of surface acoustic wave filters and/or other acoustic wave filters. One or more of the surface acoustic wave filters of the filters 1206 can be implemented in accordance with any suitable principles and advantages of the surface acoustic wave devices discussed herein.

FIG. 7 is a schematic block diagram of a module 1201 that includes power amplifiers 1202A and 1202B, switches 1204A and 1204B, and filters 1206' in accordance with one or more embodiments. The module 1201 is like the module 1200 of FIG. 6, except that the module 1201 includes an additional power amplifier 1202B and an additional switch 1204B and the filters 1206' are arranged to filter signals for the signal paths associated with a plurality of power amplifiers 1202A and 1202B. The different signal paths can be associated with different frequency bands and/or different modes of operation (e.g. different power modes, different signaling modes, etc.).

FIG. 8 is a schematic block diagram of a module 1203 that includes power amplifiers 1202A and 1202B, switches 1204A and 1204B, and filters 1206A and 1206B in accordance with one or more embodiments, and an antenna switch 1208. The module 1203 is like the module 1201 of FIG. 7, except the module 1203 includes an antenna switch 1208 arranged to selectively couple a signal from the filters 1206A or the filters 1206B to an antenna node. The filters 1206A and 1206B can correspond to the filters 1206' of FIG. 7.

Figure 9:
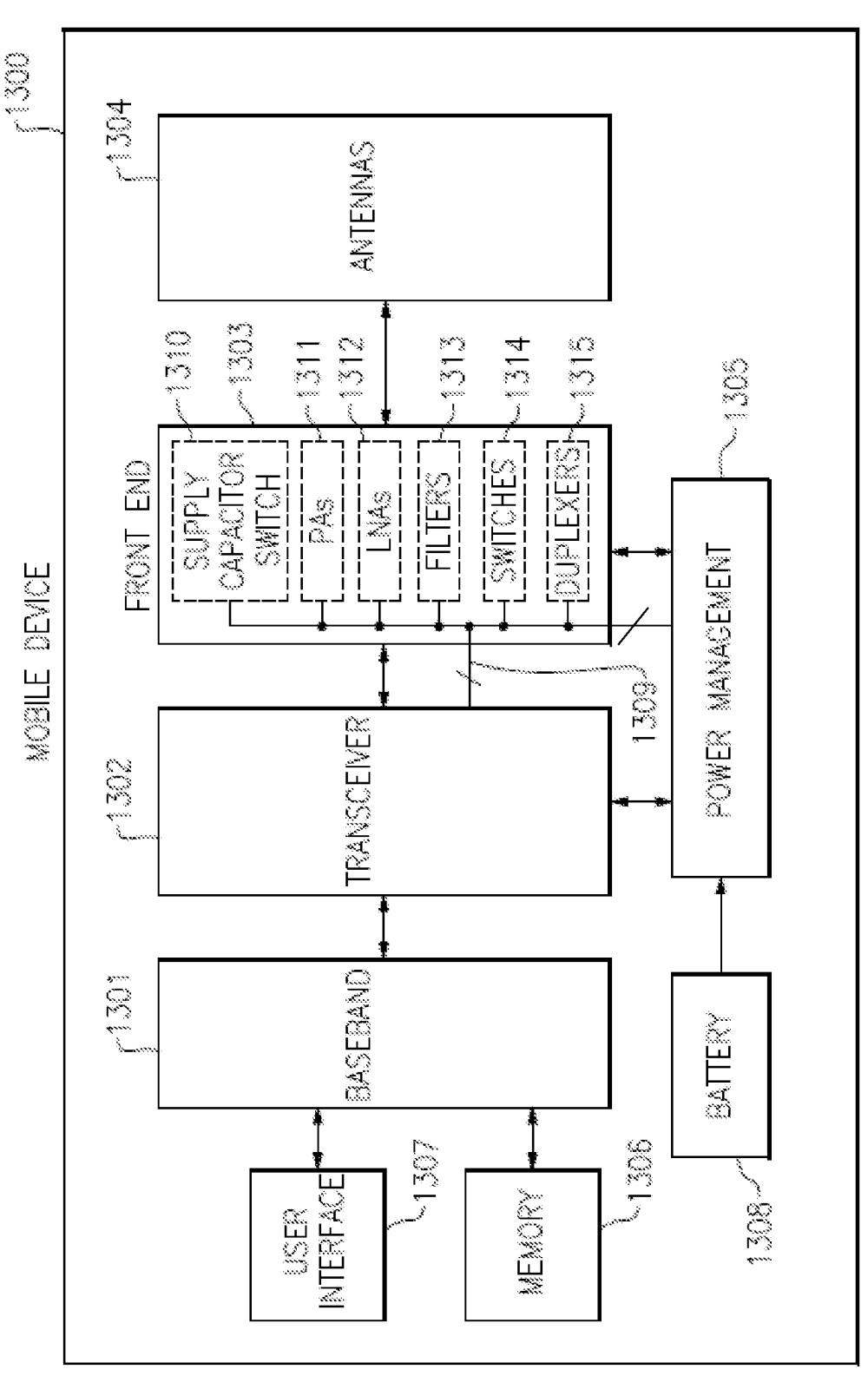
FIG. 9 is a schematic diagram of one embodiment of a wireless communication device.

FIG. 9 is a schematic diagram of one embodiment of a wireless communication device or mobile device 1300. The mobile device 1300 includes a baseband system 1301, a transceiver 1302, a front end system 1303, antennas 1304, a power management system 1305, a memory 1306, a user interface 1307, and a battery 1308.

Although the mobile device 1300 illustrates one example of an RF system that can include one or more features of the present disclosure, the teachings herein are applicable to electronic systems implemented in a wide variety of ways.

The mobile device 1300 can be used to communicate using a wide variety of communications technologies, including, but not limited to, 2G, 3G, 4G (including LTE, LTE-Advanced, and LTE-Advanced Pro), 5G, WLAN (for instance, Wi-Fi), WPAN (for instance, Bluetooth and Zig-Bee), WMAN (for instance, WiMax), and/or GPS technologies.

The transceiver 1302 generates RF signals for transmission and processes incoming RF signals received from the antennas 1304. It will be understood that various functionalities associated with the transmission and receiving of RF signals can be achieved by one or more components that are collectively represented in FIG. 9 as the transceiver 1302. In one example, separate components (for instance, separate circuits or dies) can be provided for handling certain types of RF signals.

As shown in in FIG. 9, the transceiver 1302 is connected to the front end system 1303 and to the power management circuit 1305 using a serial interface 1309. All or part of the illustrated RF components can be controlled by the serial interface 1309 to configure the mobile device 1300 during initialization and/or while fully operational. In another embodiment, the baseband processor 1301 is additionally or alternative connected to the serial interface 1309 and operates to configure one or more RF components, such as components of the front end system 1303 and/or power management system 1305.

The front end system 1303 aids in conditioning signals transmitted to and/or received from the antennas 1304. In the illustrated embodiment, the front end system 1303 includes one or more bias control circuits 1310 for controlling power amplifier biasing, one or more power amplifiers (PAs) 1311, one or more low noise amplifiers (LNAs) 1312, one or more filters 1313, one or more switches 1314, and one or more duplexers 1315. However, other implementations are possible.

For example, the front end system 1303 can provide a number of functionalities, including, but not limited to, amplifying signals for transmission, amplifying received signals, filtering signals, switching between different bands, switching between different power modes, switching between transmission and receiving modes, duplexing of signals, multiplexing of signals (for instance, diplexing or triplexing), or some combination thereof.

In certain implementations, the mobile device 1300 supports carrier aggregation, thereby providing flexibility to increase peak data rates. Carrier aggregation can be used for both Frequency Division Duplexing (FDD) and Time Division Duplexing (TDD), and may be used to aggregate a plurality of carriers or channels. Carrier aggregation includes contiguous aggregation, in which contiguous carriers within the same operating frequency band are aggregated. Carrier aggregation can also be non-contiguous, and can include carriers separated in frequency within a common band or in different bands.

The antennas 1304 can include antennas used for a wide variety of types of communications. For example, the antennas 1304 can include antennas for transmitting and/or receiving signals associated with a wide variety of frequencies and communications standards.

In certain implementations, the antennas 1304 support multiple-input and multiple-output (MIMO) communications and/or switched diversity communications. For example, MIMO communications use multiple antennas for communicating multiple data streams over a single radio frequency channel. MIMO communications benefit from higher signal to noise ratio, improved coding, and/or reduced signal interference due to spatial multiplexing differences of the radio environment. Switched diversity refers to communications in which a particular antenna is selected for operation at a particular time. For example, a switch can be used to select a particular antenna from a group of antennas based on a variety of factors, such as an observed bit error rate and/or a signal strength indicator.

The mobile device 1300 can operate with beamforming in certain implementations. For example, the front end system 1303 can include phase shifters having variable phase controlled by the transceiver 1302. Additionally, the phase shifters are controlled to provide beam formation and directivity for transmission and/or reception of signals using the antennas 1304. For example, in the context of signal transmission, the phases of the transmit signals provided to the antennas 1304 are controlled such that radiated signals from the antennas 1304 combine using constructive and destructive interference to generate an aggregate transmit signal exhibiting beam-like qualities with more signal strength propagating in a given direction. In the context of signal reception, the phases are controlled such that more signal energy is received when the signal is arriving to the antennas 1304 from a particular direction. In certain implementations, the antennas 1304 include one or more arrays of antenna elements to enhance beamforming.

The baseband system 1301 is coupled to the user interface 1307 to facilitate processing of various user input and output (I/O), such as voice and data. The baseband system 1301 provides the transceiver 1302 with digital representations of transmit signals, which the transceiver 1302 processes to generate RF signals for transmission. The baseband system 1301 also processes digital representations of received signals provided by the transceiver 1302. As shown in FIG. 9, the baseband system 1301 is coupled to the memory 1306 to facilitate operation of the mobile device 1300.

The memory 1306 can be used for a wide variety of purposes, such as storing data and/or instructions to facilitate the operation of the mobile device 1300 and/or to provide storage of user information.

The power management system 1305 provides a number of power management functions of the mobile device 1300. In certain implementations, the power management system 1305 includes a power amplifier (PA) supply control circuit that controls the supply voltages of the power amplifiers 1311. For example, the power management system 1305 can be configured to change the supply voltage(s) provided to one or more of the power amplifiers 1311 to improve efficiency, such as power added efficiency (PAE).

The power management system 1305 can operate in a selectable supply control mode, such an average power tracking (APT) mode or an envelope tracking (ET) mode. In the illustrated embodiment, the selected supply control mode of the power management system 1305 is controlled by the transceiver 1302. In certain implementations, the transceiver 1302 controls the selected supply control mode using the serial interface 1309.

As shown in FIG. 9, the power management system 1305 receives a battery voltage from the battery 1308. The battery 1308 can be any suitable battery for use in the mobile device 1300, including, for example, a lithium-ion battery. Although the power management system 1305 is illustrated as separate from the front end system 1303, in certain implementations all or part (for instance, a PA supply control circuit) of the power management system 1305 is integrated into the front end system 1303.

Having described above several aspects of at least one embodiment, it is to be appreciated various alterations, modifications, and improvements will readily occur to those skilled in the art. Such alterations, modifications, and improvements are intended to be part of this disclosure and are intended to be within the scope of the invention. Accordingly, the foregoing description and drawings are by way of example only, and the scope of the invention should be determined from proper construction of the appended claims, and their equivalents.

What is claimed is:

1. A surface acoustic wave device comprising:
a piezoelectric substrate; and
a multi-layer interdigital transducer electrode disposed on the piezoelectric substrate, the multi-layer interdigital transducer electrode including a first electrode layer and a second electrode layer, the second electrode layer being disposed between the piezoelectric substrate and the first electrode layer, the first electrode layer having a higher density than a density of the second electrode layer, the second electrode layer having a higher conductivity than a conductivity of the first electrode layer, the first electrode layer having a greater thickness than a thickness of the second electrode layer.

2. The surface acoustic wave device of claim 1 wherein the first electrode layer is made mainly of tungsten.

3. The surface acoustic wave device of claim 1 wherein the first electrode layer has a thickness of between 100 nanometers and 500 nanometers.

4. The surface acoustic wave device of claim 1 wherein the first electrode layer has a density of at least 10 grams per cubic centimeter.

5. The surface acoustic wave device of claim 1 wherein the first electrode layer is the uppermost layer of the multi-layer interdigital transducer electrode.

6. The surface acoustic wave device of claim 1 wherein the second electrode layer is made mainly of copper.

7. The surface acoustic wave device of claim 1 wherein the second electrode layer has a conductivity of at least $5\times10^7$ Siemens per meter.

8. The surface acoustic wave device of claim 1 wherein the second electrode layer has a thickness of between 100 nanometers and 500 nanometers.

9. The surface acoustic wave device of claim 1 wherein the second electrode layer has an upper surface in contact with a lower surface of the first electrode layer.

10. The surface acoustic wave device of claim 1 wherein the second electrode layer has a lower surface in contact with an upper surface of piezoelectric substrate.

11. The surface acoustic wave device of claim 1 wherein a difference between a coefficient of thermal expansion of the second electrode layer and a coefficient of thermal expansion of the first electrode layer is no more than 18 ppm/degree K.

12. The surface acoustic wave device of claim 1 wherein the multi-layer interdigital transducer electrode further includes a third electrode layer disposed between the piezoelectric substrate and the second electrode layer.

13. The surface acoustic wave device of claim 12 wherein the third electrode layer is made mainly of tungsten.

14. The surface acoustic wave device of claim 12 wherein the third electrode layer has an upper surface in contact with a lower surface of the second electrode layer.

15. The surface acoustic wave device of claim 12 wherein the third electrode layer has a lower surface in contact with an upper surface of piezoelectric substrate.

16. The surface acoustic wave device of claim 12 wherein the third electrode layer has a density of at least 10 grams per cubic centimeter.

17. The surface acoustic wave device of claim 12 wherein the third electrode layer has a higher density than the density of the second electrode layer.

18. The surface acoustic wave device of claim 12 wherein the third electrode layer has a lower conductivity than the conductivity of the second electrode layer.

19. The surface acoustic wave device of claim 12 wherein the third electrode layer is made mainly of a same material as a material forming first electrode layer.

20. The surface acoustic wave device of claim 12 wherein the multi-layer interdigital transducer electrode further includes a fourth electrode layer disposed between the piezoelectric substrate and the third electrode layer.

21. The surface acoustic wave device of claim 1 further comprising a layer of dielectric material disposed on an upper surface of the piezoelectric substrate and an upper surface of the multi-layer interdigital transducer electrode.

22. A radio frequency module comprising:
a power amplifier configured to provide a radio frequency signal; and
a surface acoustic wave filter configured to filter the radio frequency signal, the surface acoustic wave filter including
a piezoelectric substrate, and
a multi-layer interdigital transducer electrode disposed on the piezoelectric substrate, the multi-layer interdigital transducer electrode including a first electrode layer and a second electrode layer, the second electrode layer being disposed between the piezoelectric substrate and the first electrode layer, the first electrode layer having a higher density than a density of the second electrode layer, the second electrode layer having a higher conductivity than a conductivity of the first electrode layer, the first electrode layer having a greater thickness than a thickness of the second electrode layer.

23. A wireless communication device comprising:
a surface acoustic wave filter configured to provide a filtered radio frequency signal, the surface acoustic wave filter including
a piezoelectric substrate, and
a multi-layer interdigital transducer electrode disposed on the piezoelectric substrate, the multi-layer interdigital transducer electrode including a first electrode layer and a second electrode layer, the second electrode layer being disposed between the piezoelectric substrate and the first electrode layer, the first electrode layer having a higher density than a density of the second electrode layer, the second electrode layer having a higher conductivity than a conductivity of the first electrode layer, the second electrode layer having a lower surface in contact with an upper surface of piezoelectric substrate.

* * * * *